United States Patent [19]

Shin

[11] Patent Number: 5,874,844
[45] Date of Patent: Feb. 23, 1999

[54] SCHMITT TRIGGER CIRCUIT WITH AN ADJUSTABLE TRIGGER VOLTAGE

[75] Inventor: Dong Young Shin, Kyungki-do, Rep. of Korea

[73] Assignee: LG Semicon Co., Ltd., Chungcheongbuk-do, Rep. of Korea

[21] Appl. No.: 905,716

[22] Filed: Aug. 4, 1997

[30] Foreign Application Priority Data

Mar. 20, 1997 [KR] Rep. of Korea ..................... 1997-9450

[51] Int. Cl.$^6$ .................................................. H03K 3/037
[52] U.S. Cl. .......................... 327/206; 327/108; 327/333
[58] Field of Search .................................... 327/205, 206, 327/108, 109–112, 333, 427, 434, 436, 437

[56] References Cited

U.S. PATENT DOCUMENTS 4,859,873  8/1989  O'Shaughnessy et al. ............... 327/73
5,489,866  2/1996  Diba ........................................ 327/206

FOREIGN PATENT DOCUMENTS 61-237509  10/1986  Japan ..................................... 327/206
4-352512  12/1992  Japan ..................................... 327/206

Primary Examiner—Kenneth B. Wells
Attorney, Agent, or Firm—Morgan, Lewis & Bockius LLP

[57] ABSTRACT

A Schmitt trigger circuit capable of adjusting a trigger voltage includes a trigger inversion output portion for outputting an input signal by trigger inversion with a predetermined margin, first and second A/D converters for converting a voltage applied from outside to a digital signal to adjust a trigger voltage, first and second trigger voltage adjusting signal output portions for outputting adjusting signals to adjust a negative trigger voltage or a positive trigger voltage by the digital signal of the first and second A/D converters, and first and second trigger voltage adjusting portions having transistors selectively turned on/off by the adjusting signals of the first and second trigger voltage adjusting signal output portions, for outputting the adjusted trigger voltage to the trigger inversion output portion.

31 Claims, 8 Drawing Sheets

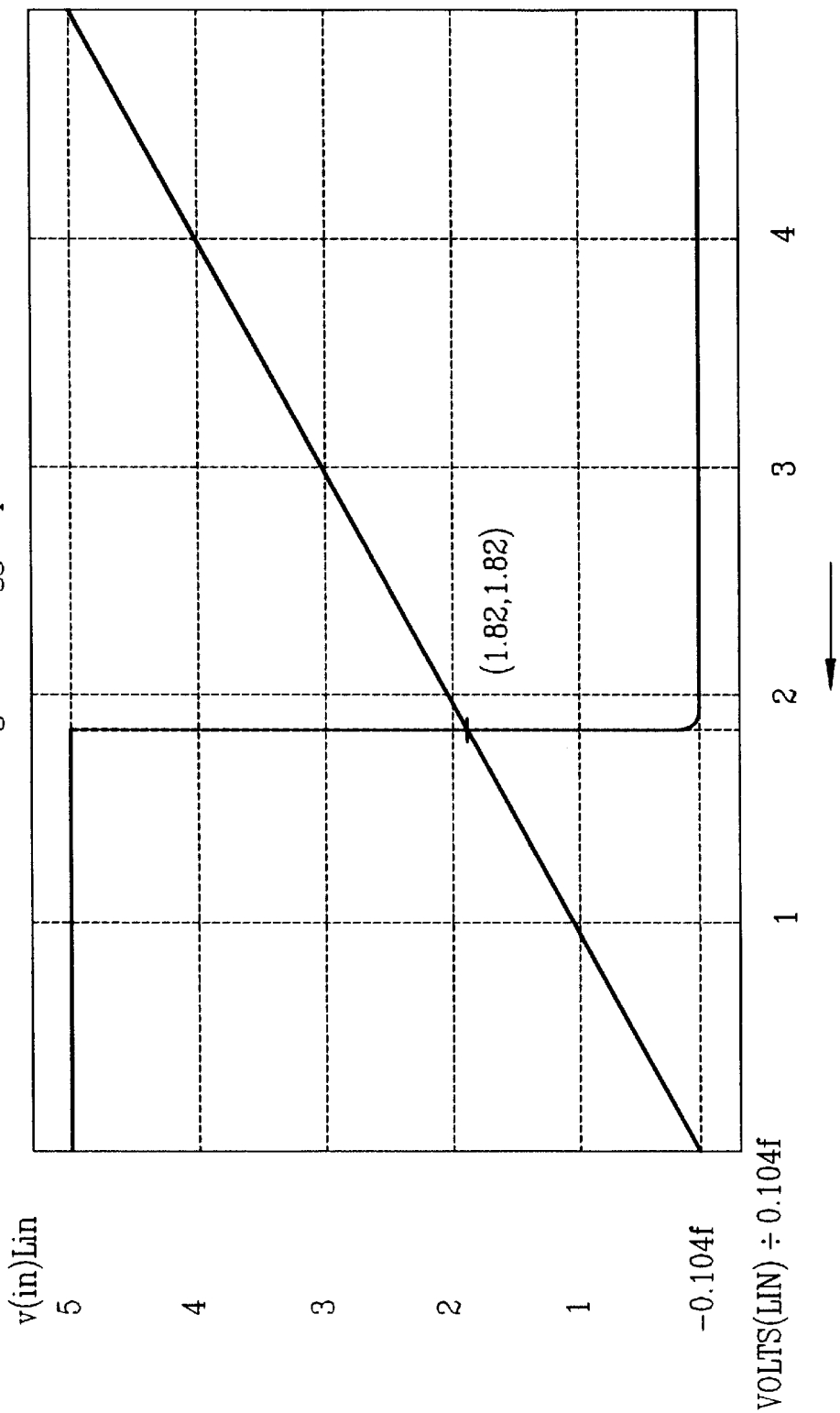

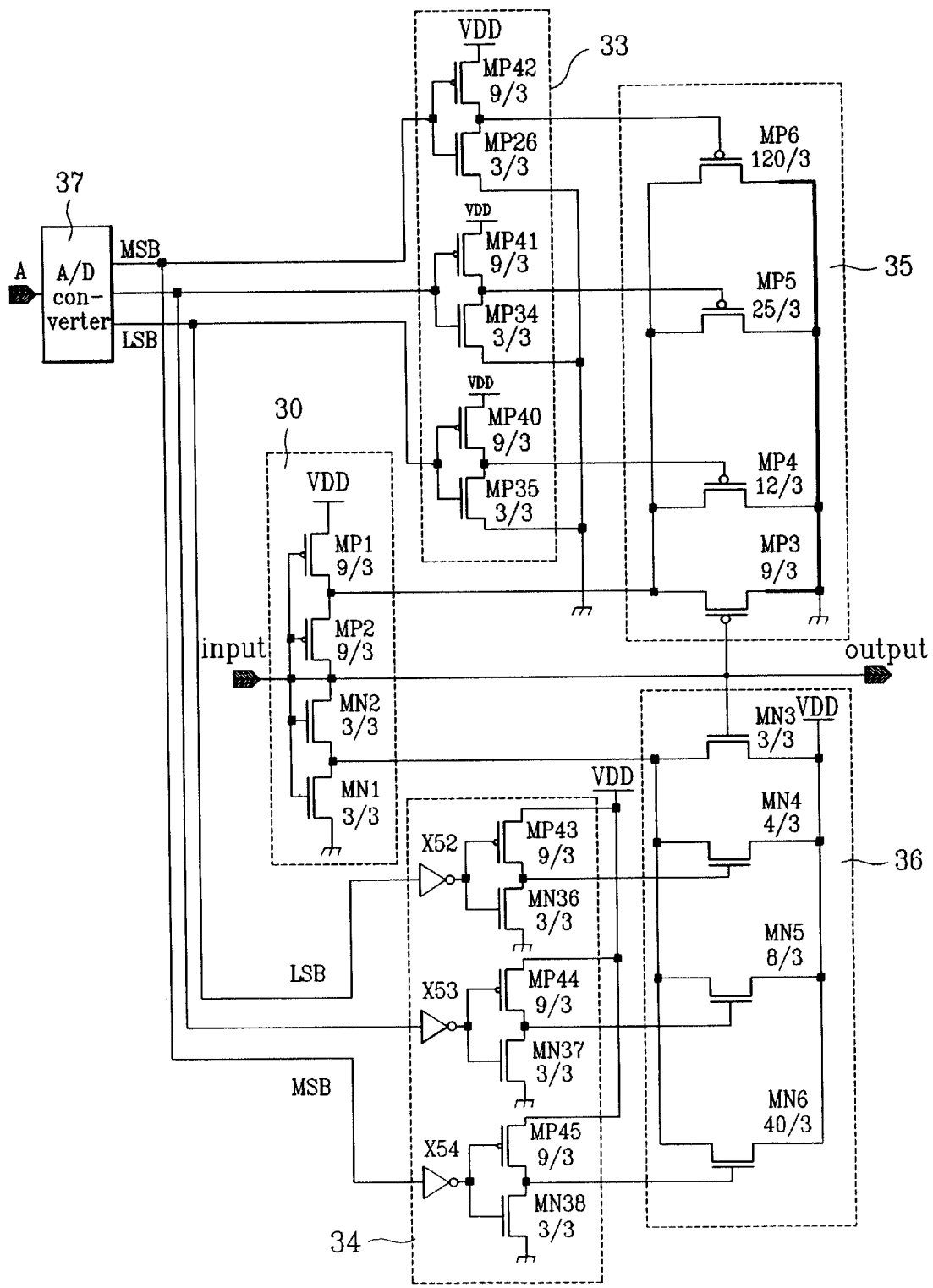
F I G.5

SCHMITT TRIGGER CIRCUIT WITH AN ADJUSTABLE TRIGGER VOLTAGE

BACKGROUND OF THE INVENTION

1. Field of the Invention

The present invention relates to a Schmitt trigger circuit, and more particularly, to a Schmitt trigger circuit.

2. Discussion of the Related Art

Generally, a Schmitt trigger circuit maintains a uniform amplitude output voltage even when an input voltage increases or decreases around a threshold voltage. The uniform amplitude output voltage is maintained that is proportional to a hysteresis coefficient. Such a Schmitt trigger circuit may be used as an input buffer which stabilizes a pulse signal and prevents chattering and noise.

A conventional Schmitt trigger circuit will be described with reference to the accompanying drawings. FIG. 1 shows a conventional Schmitt trigger circuit. FIG. 2a and FIG. 2b are graphs illustrating trigger points of a conventional Schmitt trigger circuit.

The conventional Schmitt trigger circuit having a uniform trigger voltage includes a first PMOS transistor MP1, a second PMOS transistor MP2, a second NMOS transistor MN2, and a first NMOS transistor MN1. These transistors are connected to one another in series and connected to an input terminal in common. The conventional Schmitt trigger circuit also includes a third PMOS transistor MP3 and a third NMOS transistor MN3.

The second NMOS transistor MN2 is connected to the second PMOS transistor MP2 in series. The first PMOS transistor MP1 is connected to a power source voltage terminal. The first NMOS transistor MN1 is connected to a ground terminal. Each gate of the third PMOS transistor MP3 and the third NMOS transistor MN3 is in common and connected to a drain electrode and an output terminal of the second NMOS transistor MN2 and the second PMOS transistor MP2. A drain electrode of the third PMOS transistor MP3 is connected to a source electrode of the first PMOS transistor MP1, and a source electrode of MP3 is connected to the ground terminal. A source electrode of the third NMOS transistor MN3 is connected to a source electrode of the second NMOS transistor MN2, and a drain electrode of MN3 is connected to the power source voltage terminal.

The conventional Schmitt trigger circuit may be used as a modified buffer or inverter in which a direct current transition curve has a noise margin as compared to a general buffer or inverter in which a direct current transition curve has a logic threshold voltage when the input signal transitions from low to high or from high to low.

The operation of the conventional Schmitt trigger circuit will be described with reference to FIG. 2a and FIG. 2b.

As a transition of the input signal occurs from low to high, the output signal becomes high. If the input voltage increases to exceed the threshold voltage of the first NMOS transistor MN1, the first NMOS transistor MN1 is turned on to operate the third NMOS transistor MN3. Once the third NMOS transistor MN3 is turned on, a voltage is applied to the source electrode of the second NMOS transistor MN2. At this time, to turn on the second NMOS transistor MN2, the threshold voltage of the second NMOS transistor MN2 in addition to the voltage applied to the second NMOS transistor MN2 should be applied to the gate of the second NMOS transistor MN2 because the first NMOS transistor MN1 and the third NMOS transistor MN3 have a predetermined resistivity. If the input voltage continues to increase, the output voltage becomes low to the ground voltage through MN2 and MN1.

On the other hand, when the input signal transitions from high to low, the potential level of the input terminal continues to decrease to exceed the threshold voltage of the first PMOS transistor MP1. Thus, the first PMOS transistor MP1 is turned on to operate the third PMOS transistor MP3. Once the third PMOS transistor MP3 is turned on, the first PMOS transistor MP1 and the third PMOS transistor MP3 have a predetermined resistivity. In addition, a voltage is applied to the source electrode of second PMOS transistor MP2. At this time, the voltage as low as the threshold voltage should be applied to the gate of the second PMOS transistor MP2. If the input voltage continues to decrease, the first PMOS transistor MP1 and the second PMOS transistor MP2 pass the power source voltage and the output voltage is maintained at the potential of the power source voltage.

The conventional Schmitt trigger circuit has a predetermined noise margin in accordance with an adjustment of the trigger voltage by means of the first and third PMOS transistors MP1 and MP3 and the first and third NMOS transistors MN1 and MN3.

The conventional Schmitt trigger circuit has a uniform trigger voltage as illustrated in FIG. 2a and FIG. 2b. This voltage cannot be adjusted after the fabrication of the IC. In addition, when the trigger voltage of the IC needs to be adjusted, the IC must be replaced with another IC having the desired trigger voltage level.

SUMMARY OF THE INVENTION

Accordingly, the present invention is directed to a Schmitt trigger circuit that substantially obviates one or more of the problems due to limitations and disadvantages of the related art.

An object of the present invention is to provide a Schmitt trigger circuit capable of adjusting a trigger voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a Schmitt trigger circuit capable of adjusting a trigger voltage includes a trigger inversion output portion for outputting an input signal by trigger inversion with a predetermined margin, first and second A/D converters for converting an externally applied voltage to a digital signal to adjust the trigger voltage, first and second trigger voltage adjusting signal output portions for outputting signals to adjust a negative trigger voltage or a positive trigger voltage by the digital signal of the first and second A/D converters, and first and second trigger voltage adjusting portion having transistors selectively turned on/off by the adjusting signals of the first and second trigger voltage adjusting signal output portions, for outputting the adjusted trigger voltage to the trigger inversion output portion.

In another aspect of the present invention, a Schmitt trigger circuit comprises a trigger output unit receiving an input signal and outputting the input signal having a trigger voltage; an analog-to-digital converter unit receiving an analog voltage and converting the analog voltage to a digital signal; a trigger voltage control signal output unit coupled to the analog-to-digital converter unit and outputting a control signal corresponding to the trigger voltage in response to the digital signal from the analog-to-digital converter unit; and a trigger voltage adjusting unit coupled to the trigger voltage control signal output unit outputting the trigger voltage to the trigger output unit in response to the control signal from the trigger voltage control signal output unit, the control signal controlling the trigger output unit to produce one of at least two trigger voltages.

In another aspect of the present invention, a Schmitt trigger circuit comprises a trigger output unit receiving an input signal and outputting the input signal having a trigger voltage; an input unit generating a control signal corresponding to the trigger voltage; and a trigger voltage adjusting unit coupled to the input unit outputting an adjusting signal to the trigger output unit in response to the control signal from the input unit to produce the trigger voltage, the adjusting signal controlling the trigger output unit to produce one of at least two trigger voltages.

In another aspect of the present invention, a Schmitt trigger circuit comprises a trigger output unit receiving an input signal and outputting the input signal having a trigger voltage; and a trigger voltage adjusting unit outputting an adjusting signal to the trigger output unit to produce the trigger voltage, the adjusting signal controlling the trigger output unit to produce one of at least two trigger voltages.

In a further aspect, a method for adjusting a trigger voltage in a Schmitt trigger circuit comprises the steps of receiving an input signal and outputting the input signal having a first trigger voltage; providing a trigger voltage adjusting signal corresponding to a second trigger voltage; and outputting the second trigger voltage different from the first trigger voltage in response to the adjusting signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2a and FIG. 2b are graphs illustrating trigger points of a conventional Schmitt trigger circuit;

FIG. 5 is a schematic of a Schmitt trigger circuit in accordance with a second preferred embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
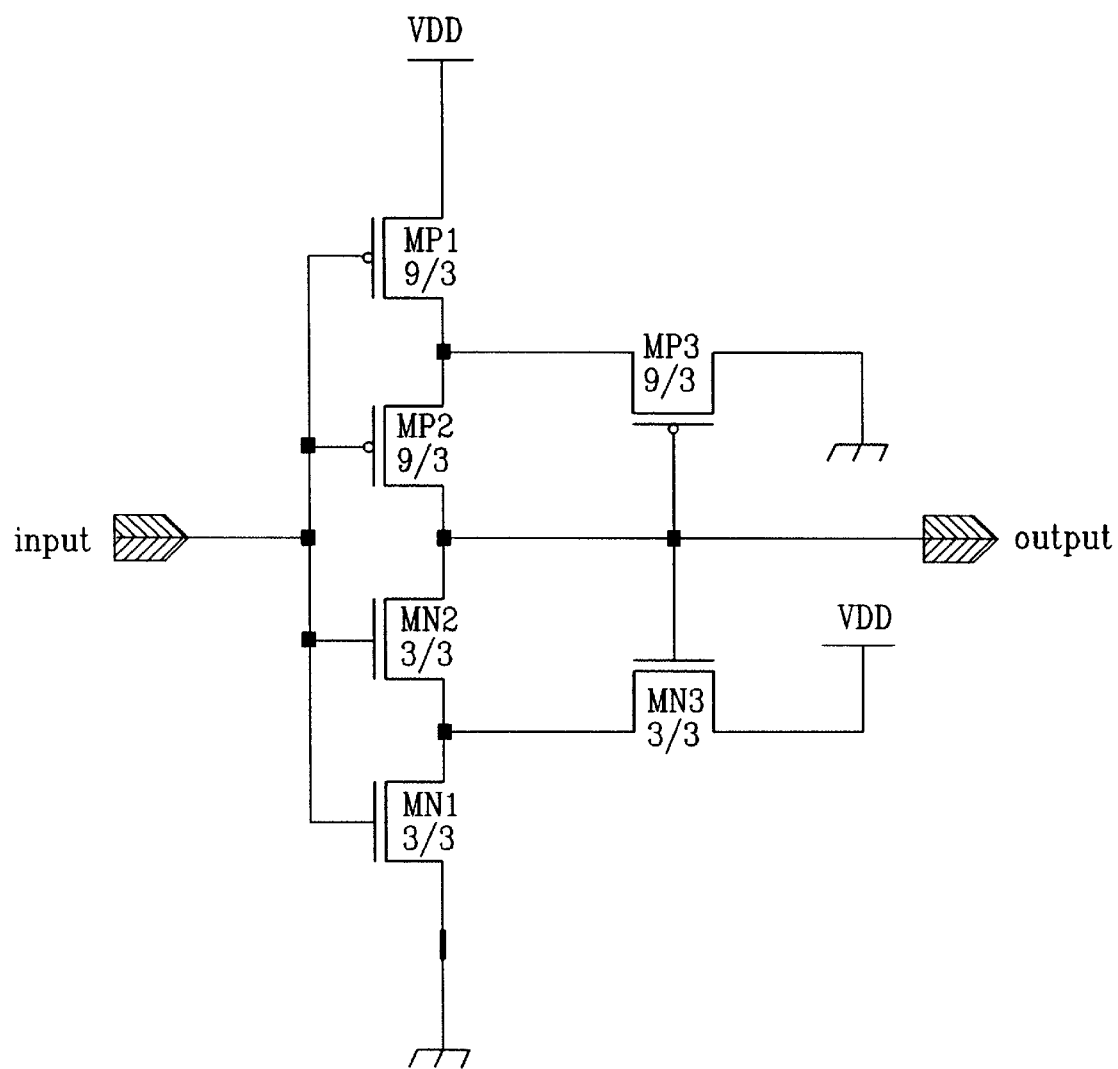
FIG. 1 is a schematic of a conventional Schmitt trigger circuit.
Figure 2B:
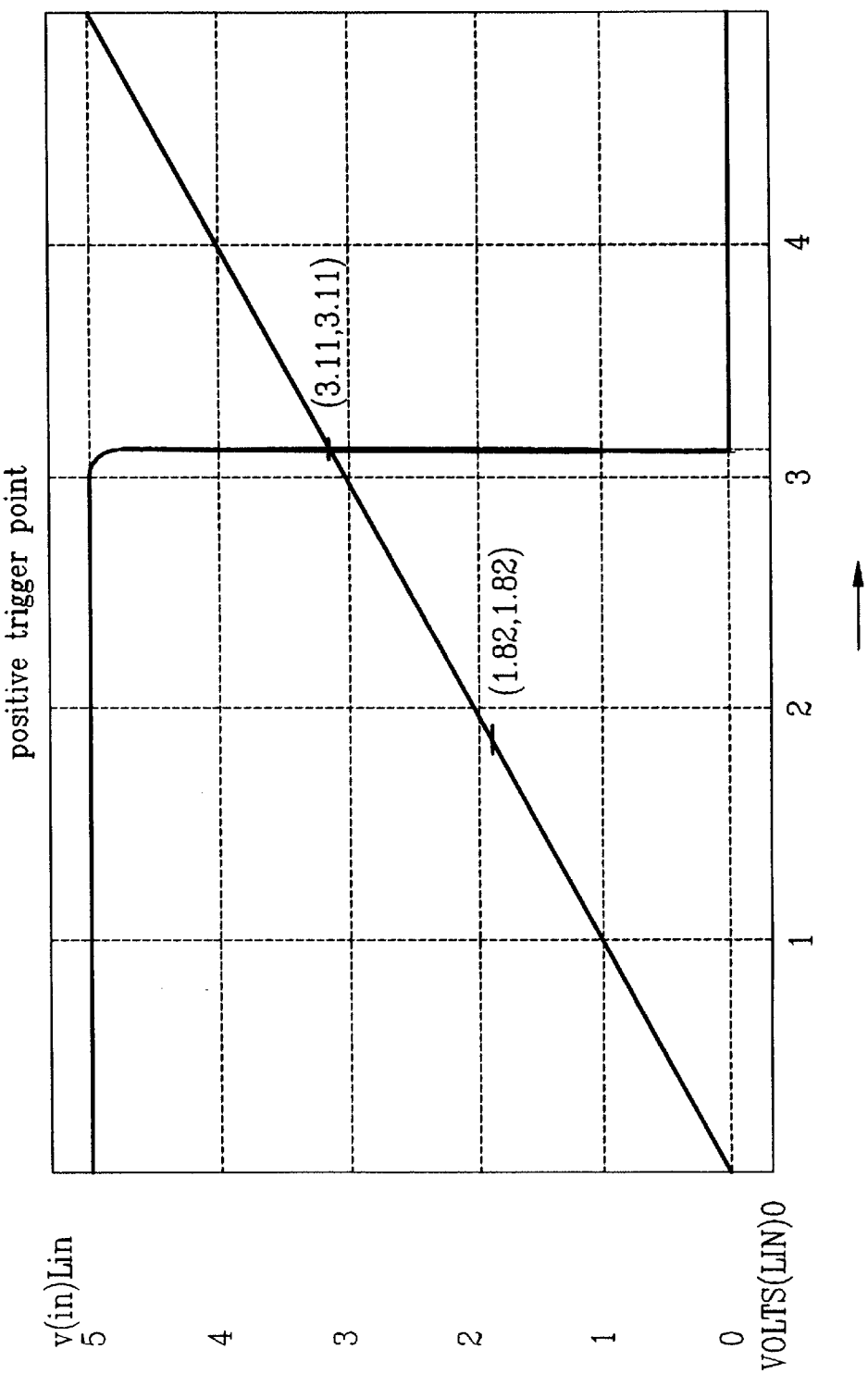
Figure 3:
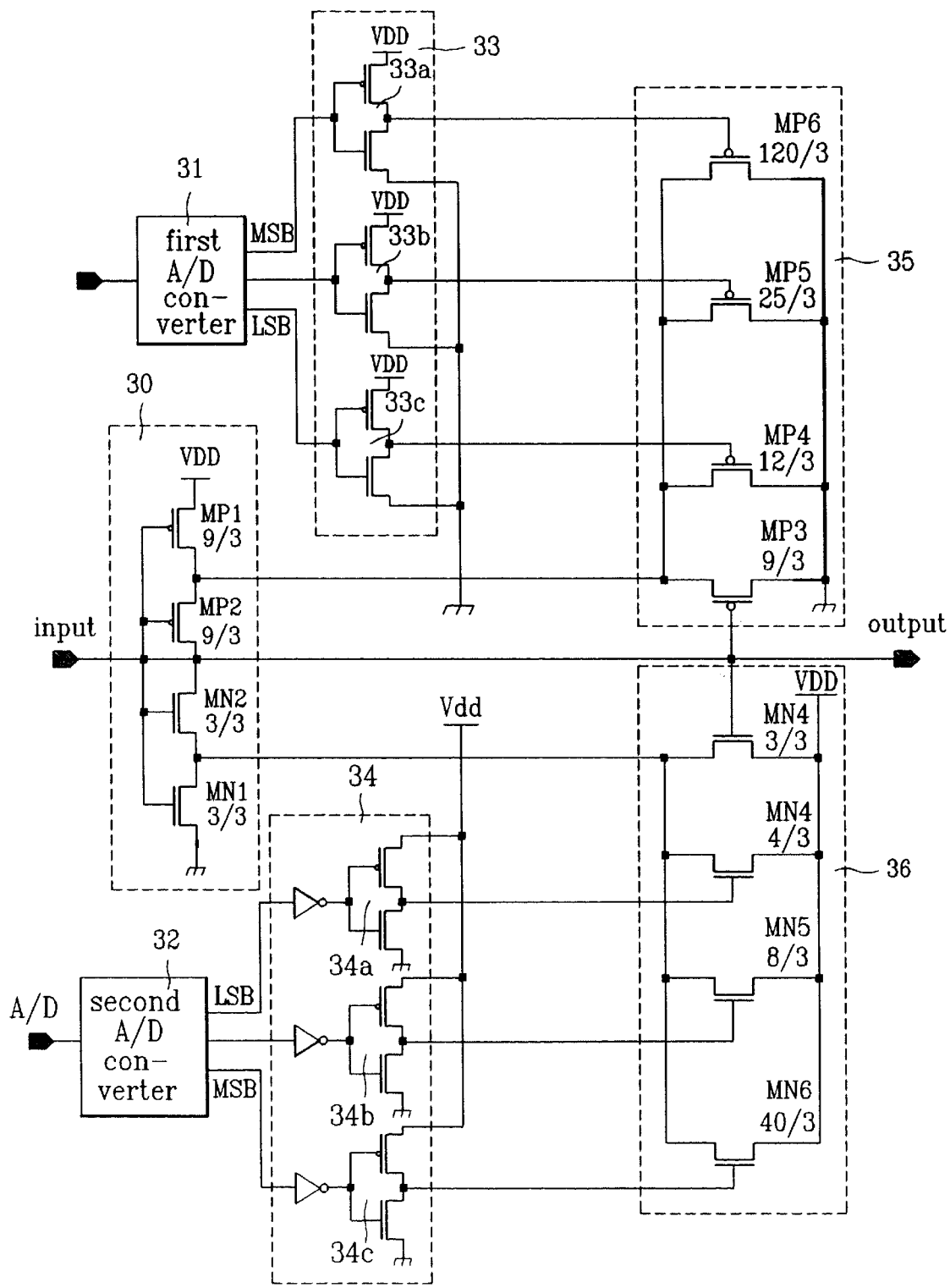
FIG. 3 is a schematic of a Schmitt trigger circuit in accordance with a first preferred embodiment of the present invention.

Referring to FIG. 3, a first embodiment of the Schmitt trigger circuit according to the present invention includes a trigger inversion output portion 30 for outputting an input signal by trigger inversion with a predetermined margin. A first A/D converter 31 converts an analog voltage externally applied to a digital signal to adjust a trigger voltage. A first trigger voltage adjusting signal output portion 33 outputs adjusting signals to adjust a negative trigger voltage using the digital signal from the first A/D converter 31. A first trigger voltage adjusting portion 35 having transistors selectively turned on/off by the adjusting signals of the first trigger voltage adjusting signal output portion 33 outputs the adjusted trigger voltage to the trigger inversion output portion 30. A second A/D converter 32 converts an analog voltage externally applied to a digital signal to adjust the trigger voltage. A second trigger voltage adjusting signal output portion 34 outputs adjusting signals to adjust a negative trigger voltage using the digital signal of the second A/D converter 32. A second trigger voltage adjusting portion 36 having transistors selectively turned on/off by the adjusting signals of the second trigger voltage adjusting signal output portion 34, outputs the adjusted trigger voltage to the trigger inversion output portion 30.

The Schmitt trigger circuit of the first embodiment which adjusts the trigger voltage level by the voltage externally applied will now be described in detail.

The trigger inversion output portion 30 includes a first PMOS transistor MP1, a second PMOS transistor MP2, a second NMOS transistor MN2, and a first NMOS transistor MN1. These transistors are connected to one another in series and connected to an input terminal in common. The second NMOS transistor MN2 is connected to the second PMOS transistor MP2 in series. A source electrode of the first PMOS transistor MP1 is connected to a power source voltage terminal VDD. A source electrode of the first NMOS transistor MN1 is connected to a ground terminal.

The first trigger voltage adjusting signal output portion 33 includes inverters for outputting the trigger voltage adjusting signals from the digital values MSB, . . . ,LSB of the first A/D converter 31. The number of the inverters is the same as that of output bits of the first A/D converter 31. For example, if the resolution of the first A/D converter 31 is 3 bits, the first trigger voltage adjusting signal output portion 33 includes three inverters.

In the preferred embodiment of the present invention, the first trigger voltage adjusting signal output portion 33 includes a first inverter 33a, a second inverter 33b, and a third inverter 33c. The first inverter 33a has a PMOS transistor and an NMOS transistor which are connected to each other in series and connected to a most significant bit (MSB) output terminal of the first A/D converter 31 in common. The second inverter 33b has a PMOS transistor and an NMOS transistor which are connected to each other in series and connected to a successive output terminal at the next level of the output terminal in common. The third inverter 33c has a PMOS transistor and an NMOS transistor which are connected to each other in series and connected to a least significant bit (LSB) output terminal of the first A/D converter 31 in common. Here, source electrodes of the respective PMOS transistors are respectively connected to power source voltage terminals VDD, and source electrodes of the NMOS transistors are connected to the output terminal of the trigger inversion output portion 30.

The second trigger voltage adjusting signal output portion 34 includes inverters for outputting the trigger voltage adjusting signals from the digital values MSB, . . . , LSB of the second A/D converter 32. The inverters are connected to the output terminals of the respective bit of the second A/D converter 32.

The second trigger voltage adjusting signal output portion 34 includes a first inverter 34a, a second inverter 34b, and a third inverter 34c. The first inverter 34a has a PMOS transistor and an NMOS transistor which are connected to each other in series and connected to an inverted LSB output terminal of the first A/D converter 31 in common. The second inverter 34b has a PMOS transistor and an NMOS transistor which are connected to each other in series and connected to an output terminal at the next level of the output terminal in common. The third inverter 34c has a PMOS transistor and an NMOS transistor which are connected to each other in series and connected to an inverted MSB output terminal of the first A/D converter 32 in common. Here, source electrodes of the respective PMOS transistors are respectively connected to the output terminal of the trigger inversion output portion 30, and source electrodes of the NMOS transistors are connected to ground terminals.

The first trigger voltage adjusting portion 35 includes third, fourth, fifth, and sixth PMOS transistors MP3, MP4, MP5, and MP6 selectively turned on/off and connected to the output terminals of the respective inverters of the first trigger voltage adjusting signal output portion 33. A gate of the third PMOS transistor MP3 is connected to the trigger inversion output portion 30. Gates of the fourth, fifth, and sixth PMOS transistors MP4, MP5, and MP6 are respectively connected to the output terminals of the first, second and third inverters 33c, 33b and 33a of the first trigger voltage adjusting signal output portion 33. The source electrodes of the respective transistors MP3, MP4, MP5 and MP6 are connected to the drain electrode of the first PMOS transistor MP1 of the trigger inversion output portion 30 in common, and the drain electrodes thereof are connected to the ground terminal.

The second trigger voltage adjusting portion 36 includes third, fourth, fifth, and sixth NMOS transistors MN3, MN4, MN5, and MN6 selectively turned on/off and connected to the output terminals of the respective inverters of the second trigger voltage adjusting signal output portion 34. A gate of the third NMOS transistor MN3 is connected to the trigger inversion output portion 30. Gates of the fourth, fifth, and sixth NMOS transistors MN4, MN5, and MN6 are respectively connected to the output terminals of the first, second, and third inverters 34a, 34b and 34c of the second trigger voltage adjusting signal output portion 34. The source electrodes of the respective transistors are connected to the drain electrode of the first NMOS transistor MN1 of the trigger inversion output portion 30 in common, and the drain electrodes thereof are connected to the power source voltage terminal VDD.

The operation of the Schmitt trigger circuit capable of adjusting a trigger voltage according to the first embodiment of the present invention will be described below.

As the input signal transitions from high to low (that is, during a negative trigger), the potential level of the input terminal of the trigger inversion output portion 30 continues to decrease. If it exceeds the threshold voltage of the first PMOS transistor MP1, the first PMOS transistor MP1 is turned on. At this time, the transistors of the first trigger voltage adjusting portion 35 are selectively turned on/off, and the first PMOS transistor MP1 and the first trigger voltage adjusting portion 35 take on resistivity. Here, the resistivity depends on the transistors turned on in the first trigger voltage adjusting portion 35. Once the transistors of the first trigger voltage adjusting portion 35 are selectively turned on/off, a voltage is applied to the source electrode of the second PMOS transistor MP2. At this time, to turn on the second PMOS transistor MP2, a voltage as low as the threshold voltage of the second PMOS transistor MP2 should be applied to the gate of the second PMOS transistor MP2. If the input voltage continues to decrease, the first PMOS transistor MP1 and the second PMOS transistor MP2 pass the power source voltage so that the output voltage becomes the power source voltage potential.

Meanwhile, when the input signal transitions from low to high (that is, during a positive trigger), the potential level of the input terminal of the trigger inversion output portion 30 continues to increase. If it exceeds the threshold voltage of the first NMOS transistor MN1, the first NMOS transistor MN1 is turned on. Then, the transistors of the second trigger voltage adjusting portion 36 are selectively turned on/off, and a voltage is applied to the source electrode of the second NMOS transistor MN2. At this time, to turn on the second NMOS transistor MN2, the threshold voltage of the second NMOS transistor MN2 in addition to the voltage applied to the second NMOS transistor MN2 should be applied to the gate of the second NMOS transistor MN2 because the first NMOS transistor MN1 and the transistors of the second trigger voltage adjusting portion 36 take on a predetermined resistivity. Here, the resistivity depends on the transistors turned on in the second trigger voltage adjusting portion 36. If the input voltage continues to increase, the output voltage becomes low to the ground voltage potential.

The operation of the Schmitt trigger circuit according to the present invention which adjusts the trigger voltage level by a selective signal input by a user will now be described in detail with reference to FIG. 4a and FIG. 4b.

First, the user inputs an adjusting signal through an outer input terminal to adjust the trigger voltage level. The adjusting signal is input to the first A/D converter 31 and the second A/D converter 32 and then converted to a digital signal having a predetermined resolution. At this time, the adjusting signal which converts the trigger voltage level of the negative trigger operation (when the input signal transitions from high to low) is input to the first A/D converter 31, and the adjusting signal which converts the trigger voltage level of the positive trigger operation (when the input signal transitions from low to high) is input to the second A/D converter 32. Thus, the user may adjust the voltage levels of the negative trigger and the positive trigger with a uniform width or a different width.

The adjusting signal converted by the first and second A/D converters 31 and 32 is input to the first trigger voltage adjusting signal output portion 33 and the second trigger voltage adjusting signal output portion 34, respectively.

At this time, the MSB value output from the first A/D converter 31 is input to the first inverter 33a of the first trigger voltage adjusting signal output portion 33, and the bit value at the next level is input to the second inverter 33b of the first trigger adjusting signal output portion 33. The LSB value is input to the third inverter 33c of the first trigger adjusting signal output portion 33.

The LSB value output from the second A/D converter 32 is input to the first inverter 34a of the second trigger voltage adjusting signal output portion 34, and the bit value at the next level is input to the second inverter 34b of the second trigger voltage adjusting signal output portion 34. The MSB value is input to the third inverter 34c of the second trigger adjusting signal output portion 34.

In the preferred embodiment of the present invention, the resolution of the A/D converter is 3 bits. To finely adjust the trigger voltage, the A/D converter may have more than 3 bits of resolution by including additional inverters in the trigger adjusting signal output portion. Thus, the trigger voltage adjusting portion may also include additional transistors.

The respective trigger voltage adjusting signals output from the first and second trigger voltage adjusting signal output portions 33 and 34 are input to the gates of the respective transistors of the first and second trigger voltage adjusting portions 35 and 36 to selectively turn on/off the transistors. Since the transistors of the first and second trigger voltage adjusting portions 35 and 36 have gates of different widths and lengths, their gate resistivity, that is, parallel resistivity, depends on their turn-on/off operation.

Figure 4A:
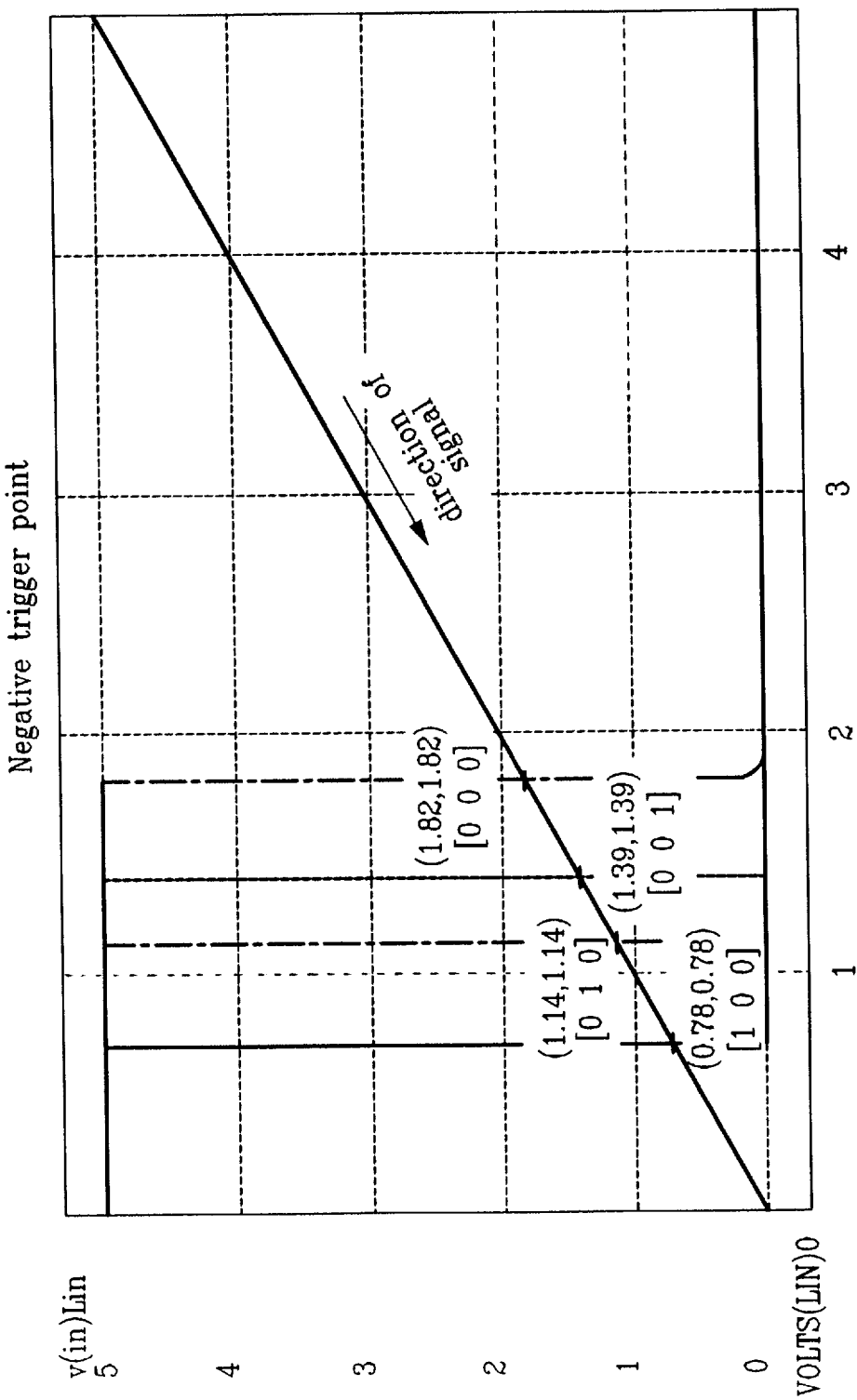
FIG. 4a and FIG. 4b are graphs illustrating trigger points of a Schmitt trigger circuit according to the present invention.

As a result, as illustrated in FIG. 4a, the resistivity of the third PMOS transistor MP3 and the first PMOS transistor MP1 is varied during negative triggering operation so that the trigger voltage level is varied. In the same manner, as illustrated in FIG. 4b, the resistivity of the third NMOS transistor MN3 and the first NMOS transistor MN1 is varied during positive triggering operation so that the trigger voltage level is varied.

Figure 4B:
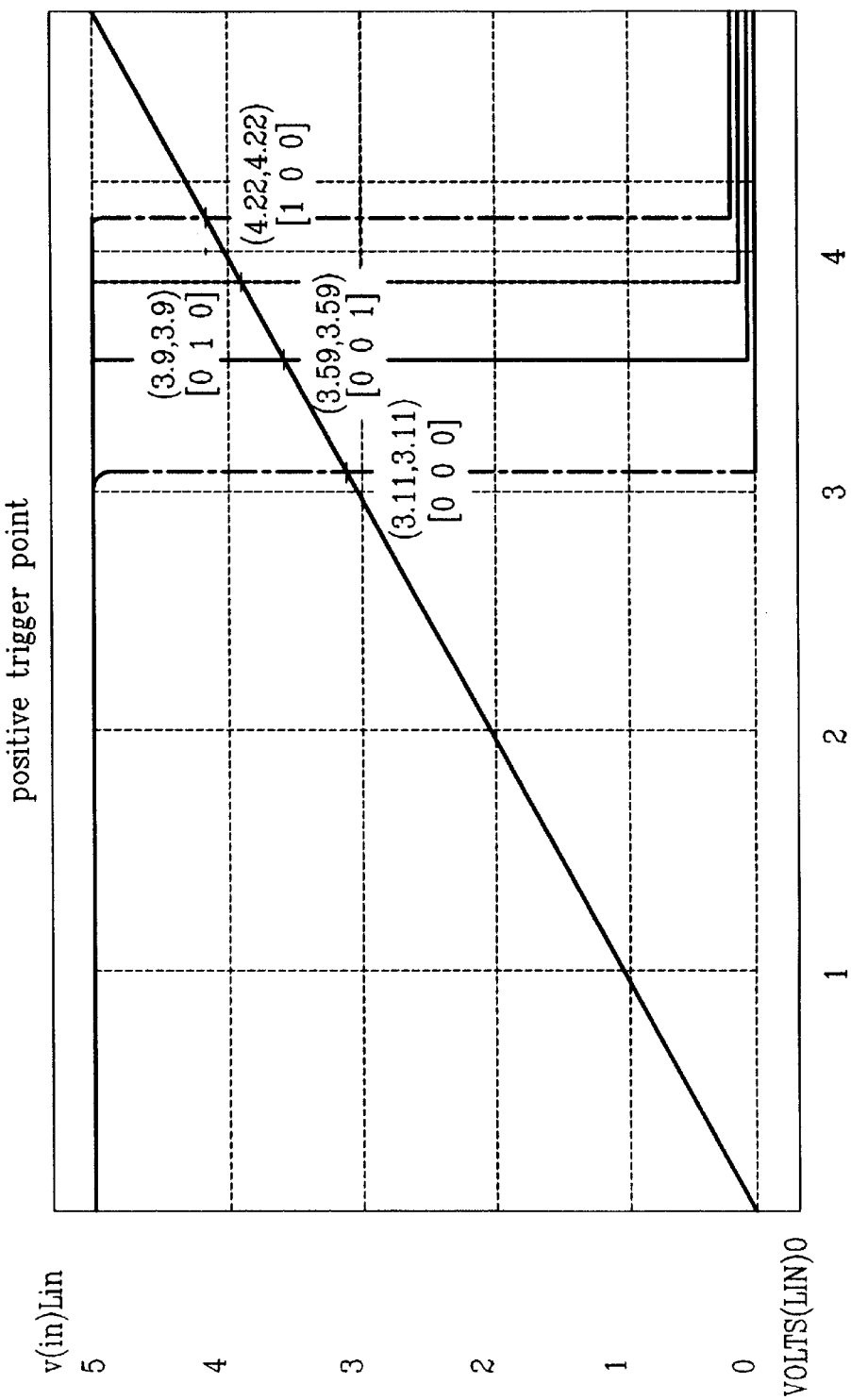

Referring to FIG. 4a and FIG. 4b, trigger points are varied depending on whether the output values from the first and second A/D converters 31 and 32 correspond to any one of [0 0 0], [0 0 1], [0 1 0], [1 0 0]. This means that the user may vary the voltage input to the first and second A/D converters 31 and 32 so as to vary the trigger voltage level.

Another Schmitt trigger circuit according to a second embodiment of the present invention will be described with reference to FIG. 5.

The Schmitt trigger circuit of the second embodiment illustrated in FIG. 5 adjusts the trigger voltage level by a selective signal input by a user during negative or positive triggering operation.

In this embodiment, one A/D converter 37 varies the negative and positive trigger voltage levels at the same time. Such a Schmitt trigger circuit includes a trigger inversion output portion 30 for outputting an input signal by trigger inversion with a predetermined margin. An A/D converter 37 converts a voltage externally applied to a digital signal to adjust a trigger voltage. A first trigger voltage adjusting signal output portion 33 outputs an adjusting signal to adjust a negative trigger voltage using the digital signal from the A/D converter 37. A first trigger voltage adjusting portion 35 having transistors selectively turned on/off by the adjusting signal of the first trigger voltage adjusting signal output portion 33 outputs the adjusted trigger voltage to the trigger inversion output portion 30. A second trigger voltage adjusting signal output portion 34 outputs an adjusting signal to adjust a negative trigger voltage using the digital signal from the A/D converter 37. A second trigger voltage adjusting portion 36 having transistors selectively turned on/off by the adjusting signal of the second trigger voltage adjusting signal output portion 34 outputs the adjusted trigger voltage to the trigger inversion output portion 30.

Another Schmitt trigger circuit according to a third embodiment of the present invention will be described with reference to FIG. 6.

Figure 6:
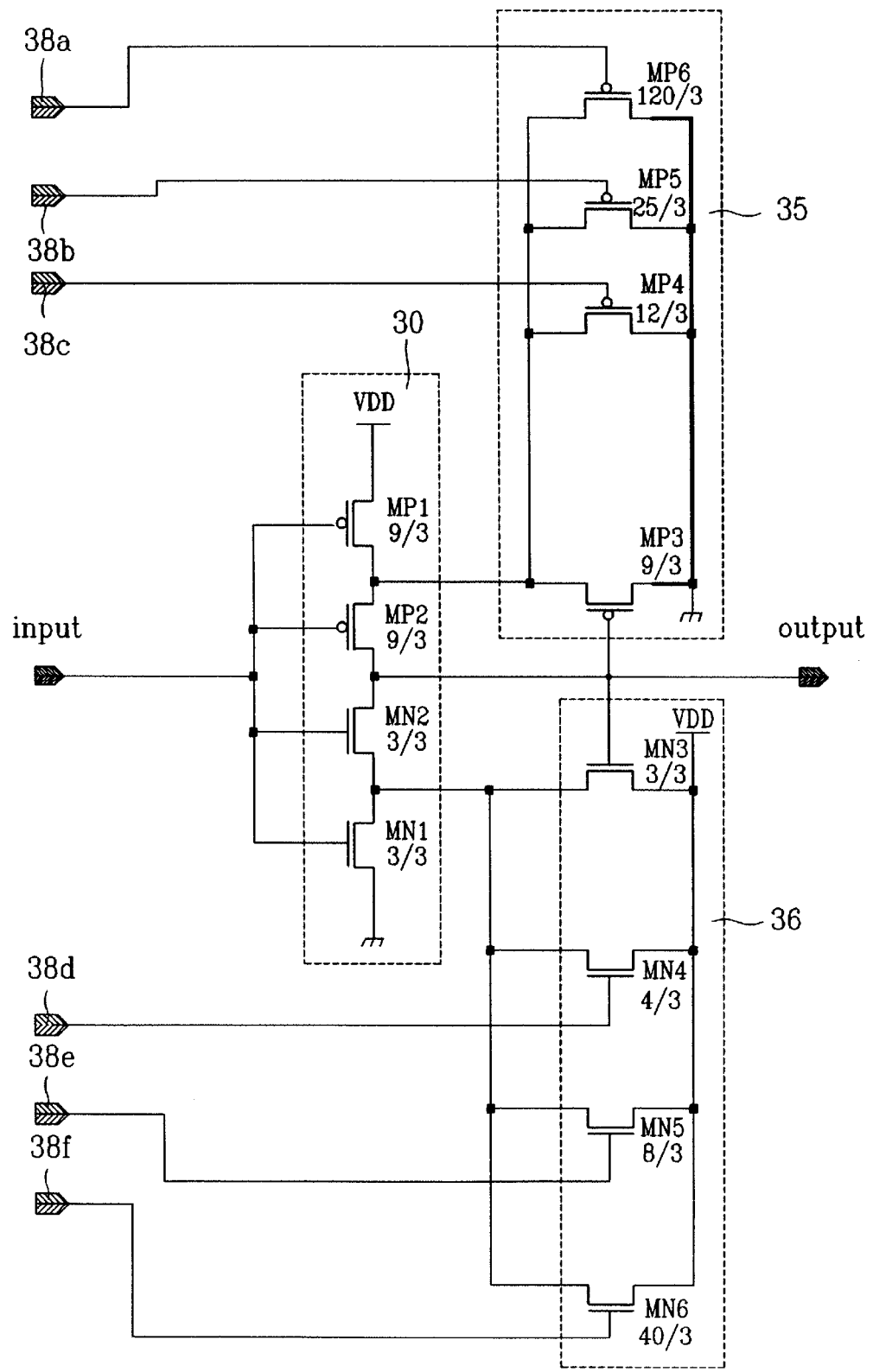
FIG. 6 is a schematic of a Schmitt trigger circuit in accordance with a third preferred embodiment of the present invention.

The Schmitt trigger circuit illustrated in FIG. 6 adjusts a trigger voltage level by a selective signal input by a user during negative or positive triggering operation. In this embodiment, the trigger voltage adjusting signal directly input from outside adjusts the trigger voltage without using an A/D converter. In other words, the trigger voltage adjusting signal is input to the first and second trigger voltage adjusting portions 35 and 36 through a plurality of trigger voltage adjusting signal input portions 38a, 38b, 38c, 38d, 38e and 38f. Such a Schmitt trigger circuit includes a trigger inversion output portion 30 for outputting an input signal by trigger inversion with a predetermined margin. A plurality of trigger voltage adjusting signal input portions 38a, 38b, 38c, 38d, 38e, and 38f input a voltage externally applied according to the user's selection. A first trigger voltage adjusting portion 35 having transistors selectively turned on/off by the adjusting signals of the trigger voltage adjusting signal input portions 38a, 38b, and 38c outputs the adjusted trigger voltage to the trigger inversion output portion 30. A second trigger voltage adjusting portion 36 having transistors selectively turned on/off by the adjusting signals of the trigger voltage adjusting signal input portions 38d, 38e, and 38f outputs the adjusted trigger voltage to the trigger inversion output portion 30.

As aforementioned, the Schmitt trigger circuit capable of the trigger voltage according to the present invention has the following advantages.

The Schmitt trigger circuit of the present invention is capable of adjusting the trigger voltage by varying the trigger voltage level. The trigger voltage level is varied according to an intensity of a voltage applied to an outer control pin of an IC as desired by the user. Thus, the Schmitt trigger circuit is beneficial in developing the IC. In addition, when the trigger voltage needs to be adjusted in an IC, the trigger voltage can be adjusted without replacing the IC.

It will be apparent to those skilled in the art that various modifications and variations can be made in the Schmitt trigger circuit of the present invention without departing from the spirit or scope of the invention. Thus, it is intended that the present invention cover the modifications and variations of the invention provided they come within the scope of the appended claims and their equivalents.

What is claimed is:

1. A Schmitt trigger circuit comprising:
   a trigger output unit receiving an input signal and outputting a signal having a trigger voltage;
   an analog-to-digital converter unit receiving an analog voltage and converting the analog voltage to a digital signal;
   a trigger voltage control signal output unit coupled to the analog-to-digital converter unit and outputting a control signal in response to the digital signal from the analog-to-digital converter unit; and
   a trigger voltage adjusting unit coupled to the trigger voltage control signal output unit for outputting an adjusting signal to the trigger output unit in response to the control signal from the trigger voltage control signal output unit, wherein
   the trigger output unit produces one of at least two trigger voltages based on the adjusting signal.

2. The Schmitt trigger circuit according to claim 1, wherein the analog-to-digital converter unit includes first and second analog-to-digital converters;
   the trigger voltage control signal output unit includes first and second trigger control signal output portions coupled to the first and second analog-to-digital converters, respectively; and
   the trigger voltage adjusting unit including first and second trigger adjusting portions coupled to the first and second trigger voltage control signal output portions, respectively, the first and second trigger voltage adjusting portions being coupled to each other at the output of the trigger output unit.

3. The Schmitt trigger circuit according to claim 1, wherein the trigger voltage includes one of a negative trigger voltage and a positive trigger voltage.

4. The Schmitt trigger circuit according to claim 1, wherein the trigger voltage adjusting unit includes a plurality of transistors selectively turned on and off by the control signal from the trigger voltage control signal output unit.

5. The Schmitt trigger circuit according to claim 4, wherein the transistors of the trigger voltage control unit have gates with different width to length ratios, respectively.

6. The Schmitt trigger circuit according to claim 5, wherein the analog-to-digital converter unit outputs a most significant bit value to a transistor gate of the transistors of the trigger voltage control unit having the largest width to length ratio.

7. The Schmitt trigger circuit according to claim 5, wherein the analog-to-digital converter unit outputs a least significant bit value to a transistor gate of the transistors of the trigger voltage control unit having the smallest width to length ratio.

8. The Schmitt trigger circuit according to claim 1, wherein the trigger output unit includes:
first and second PMOS transistors connected in series; and
first and second NMOS transistors connected in series and coupled to the PMOS transistors, the PMOS and NMOS transistors being connected to a common input terminal for receiving the input signal.

9. The Schmitt trigger circuit according to claim 8, wherein the first PMOS transistor has an electrode connected to a first voltage terminal and the first NMOS transistor has an electrode connected to a second voltage terminal.

10. The Schmitt trigger circuit according to claim 9, wherein the first voltage terminal outputs power voltage and the second voltage terminal outputs ground voltage.

11. The Schmitt trigger circuit according to claim 1, wherein the trigger voltage control signal output unit includes inverters respectively outputting the control signal in response to the digital signal from the analog-to-digital converter unit.

12. The Schmitt trigger circuit according to claim 11, wherein the number of inverters corresponds to the number of output bits of the analog-to-digital converter unit.

13. The Schmitt trigger circuit according to claim 11, wherein each of the inverters includes a PMOS transistor having an electrode connected to a first voltage terminal and an NMOS transistor having an electrode connected to an output terminal of the trigger output unit, the PMOS and NMOS transistors being coupled to each other in series.

14. The Schmitt trigger circuit according to claim 1, wherein the trigger voltage control signal output unit includes inverters respectively outputting the control signal in response to an inverted one of the digital signal from the analog-to-digital converter unit.

15. The Schmitt trigger circuit according to claim 14, wherein the number of inverters corresponds to the number of output bits of the analog-to-digital converter unit.

16. The Schmitt trigger circuit according to claim 14, wherein each of the inverters includes a PMOS transistor having an electrode connected to an output terminal of the trigger output unit and an NMOS transistor having an electrode connected to a ground terminal, the PMOS and NMOS transistors being coupled to each other in series.

17. The Schmitt trigger circuit according to claim 1, wherein the trigger voltage control signal output unit includes:
a first trigger voltage control signal output portion including inverters respectively outputting the control signal in response to the digital signal from the analog-to-digital converter unit, the number of inverters corresponding to the number of output bits of the analog-to-digital converter unit, each of the inverters including a first PMOS transistor having an electrode connected to a first voltage terminal and a first NMOS transistor having an electrode connected to an output terminal of the trigger output unit, the first PMOS and first NMOS transistors being coupled to each other in series; and
a second trigger voltage control signal output portion including inverters respectively outputting the control signal in response to an inverted one of the digital signal from the analog-to-digital converter unit, the number of inverters corresponding to the number of output bits of the analog-to-digital converter unit, each of the inverters including a second PMOS transistor having an electrode connected to an output terminal of the trigger output unit and an NMOS transistor having an electrode connected to a ground terminal, the second PMOS and second NMOS transistors being coupled to each other in series.

18. A Schmitt trigger circuit comprising:
a trigger output unit receiving an input signal and outputting a signal having a trigger voltage;
an input unit generating a control signal corresponding to an analog input, the input unit including an analog-to-digital converter unit for receiving the analog input; and
a trigger voltage adjusting unit coupled to the input unit for outputting an adjusting signal to the trigger output unit in response to the control signal from the input unit, wherein
the trigger output unit produces one of at least two trigger voltages based on the adjusting signal.

19. The Schmitt trigger circuit according to claim 18, wherein the trigger voltage adjusting unit includes first and second trigger voltage adjusting portions coupled to each other at an output of the trigger output unit.

20. The Schmitt trigger circuit according to claim 19, wherein the transistors of the trigger voltage adjusting portions have gates with different width to length ratios, respectively.

21. The Schmitt trigger circuit according to claim 18, wherein the trigger voltage adjusting unit includes a plurality of transistors selectively turned on and off by the control signal from the input unit.

22. The Schmitt trigger circuit according to claim 18, wherein the trigger output unit includes:
first and second PMOS transistors connected in series; and
first and second NMOS transistors connected in series and coupled to the PMOS transistors, the PMOS and NMOS transistors being connected to a common input terminal for receiving the input signal.

23. The Schmitt trigger circuit according to claim 22, wherein the first PMOS transistor has an electrode connected to a first voltage terminal and the first NMOS transistor has an electrode connected to a second voltage terminal.

24. The Schmitt trigger circuit according to claim 23, wherein the first voltage terminal outputs power voltage and the second voltage terminal outputs ground voltage.

25. A Schmitt trigger circuit comprising:
a trigger output unit receiving an input signal and outputting a signal having a trigger voltage; and a trigger voltage adjusting unit outputting an adjusting signal to the trigger output unit, wherein the trigger output unit produces one of at least two trigger voltages based on the adjusting signal, and the trigger voltage adjusting unit includes first and second trigger voltage adjusting portions directly coupled to each other at an output of the trigger output unit.

26. The Schmitt trigger circuit according to claim 25, wherein the transistors of the trigger voltage adjusting portions have gates with different widths and lengths, respectively.

27. The Schmitt trigger circuit according to claim 25, wherein the trigger voltage adjusting unit includes a plurality of transistors selectively turned on and off.

28. The Schmitt trigger circuit according to claim 25, wherein the trigger output unit includes:

first and second PMOS transistors connected in series; and first and second NMOS transistors connected in series and coupled to the PMOS transistors, the PMOS and NMOS transistors being connected to a common input terminal for receiving the input signal.

29. The Schmitt trigger circuit according to claim 28, wherein the first PMOS transistor has an electrode connected to a first voltage terminal and the first NMOS transistor has an electrode connected to a second voltage terminal.

30. The Schmitt trigger circuit according to claim 28, wherein the first voltage terminal outputs power voltage and the second voltage terminal outputs ground voltage.

31. A method for adjusting a trigger voltage in a Schmitt trigger circuit, the method comprising the steps of:

receiving an input signal and outputting a signal having a first trigger voltage;

providing a trigger voltage adjusting signal corresponding to a second trigger voltage; and outputting the second trigger voltage different from the first trigger voltage in response to the adjusting signal, wherein the step of providing the trigger voltage adjusting signal includes the step of receiving an analog voltage and converting the analog voltage to a digital signal corresponding to the trigger voltage adjusting signal.

* * * * *